(12) United States Patent
Ruckerbauer et al.

(10) Patent No.: US 7,404,136 B2
(45) Date of Patent: *Jul. 22, 2008

(54) SEMICONDUCTOR MEMORY DEVICE INCLUDING A SIGNAL CONTROL DEVICE AND METHOD OF OPERATING THE SAME

(75) Inventors: Hermann Ruckerbauer, Moos (DE); Dominique Savignac, Ismaning (DE)

(73) Assignee: Infineon Technologies AG, Munich (DE)

( * ) Notice: Subject to any disclaimer, the term of this patent is extended or adjusted under 35 U.S.C. 154(b) by 382 days.

This patent is subject to a terminal disclaimer.

(21) Appl. No.: 11/182,063

(22) Filed: Jul. 15, 2005

(65) Prior Publication Data

US 2007/0033487 A1 Feb. 8, 2007

(51) Int. Cl.
*H03M 13/00* (2006.01)
(52) U.S. Cl. ...................................... 714/758
(58) Field of Classification Search ........................ None
See application file for complete search history.

(56) References Cited

U.S. PATENT DOCUMENTS

| | | | | |
|---|---|---|---|---|
| 3,755,791 A | * | 8/1973 | Arzubi | 365/200 |
| 5,134,616 A | * | 7/1992 | Barth et al. | 714/711 |
| 5,278,847 A | * | 1/1994 | Helbig et al. | 714/764 |
| 5,784,391 A | * | 7/1998 | Konigsburg | 714/773 |
| 2002/0188897 A1 | * | 12/2002 | Ruckerbauer et al. | 714/710 |

* cited by examiner

*Primary Examiner*—Guy J Lamarre
*Assistant Examiner*—Sam Rizk
(74) *Attorney, Agent, or Firm*—Edell, Shapiro & Finnan, LLC

(57) ABSTRACT

A semiconductor memory device including semiconductor memory cells with at least one memory cell capable of either acting as a storage device for ECC information or of acting as a redundant memory cell is provided. The semiconductor memory device further includes a signal control device for signaling if the at least one memory cell is to be used either as a storage device or as a redundant memory cell. A method of operating a semiconductor memory device is also provided including the steps of registering a status of a signal device and, depending on the status of the signal device, operating the at least one memory cell either as a storing device for ECC information or as a redundant memory cell.

9 Claims, 1 Drawing Sheet

SEMICONDUCTOR MEMORY DEVICE INCLUDING A SIGNAL CONTROL DEVICE AND METHOD OF OPERATING THE SAME

FIELD OF THE INVENTION

The invention relates to a semiconductor memory device and to a method of operating a semiconductor memory device.

BACKGROUND

Most memory components (e.g., integrated circuits such as DRAMs) are generally fabricated with 1 bit-, 4 bit-, or 8 bit-wide input/output lines. In any of these configurations, the components cannot operate as memories having an error correction code (ECC). There are, however, memory components fabricated with 5 bit- or 9 bit-wide input/output lines. These components operate as memories having an ECC, with the $5^{th}$ (or the $9^{th}$) line used as an ECC line.

Memory modules (e.g., DIMMs (Dual Inline Memory Modules) or SIMMs (Single Inline Memory Modules)) comprise, among other components, a plurality of memory components. These memory modules may include memory components equipped with only 1 bit-, 4 bit-, or 8 bit-wide input/output lines; consequently, no ECC mode can be run on the memory module. To provide an ECC function, an extra memory component is provided that operates exclusively as an ECC, cooperating with memory components comprising 1 bit-, 4 bit- or 8 bit-wide input/output lines. Alternatively, memory modules may include memory components equipped with 5 bit- or 9 bit-wide input/output lines. In this case, ECC operation is available with each of the memory components.

The use of such memory components is exclusive—semiconductor memory components or semiconductor memory modules equipped with ECC capability can only be used in an ECC computer system (and not in a computer system lacking ECC functionality). Conversely, individual memory components or modules not equipped with an ECC capability can only be used in systems having no ECC functionality (i.e., they cannot be used in ECC-capable systems).

SUMMARY AND OBJECTS OF INVENTION

Accordingly, it is an object of the present invention to provide a semiconductor memory device configured to operate within both an ECC computer system and a computer system not having ECC capability.

It is a further object of the present invention to provide a method for operating a semiconductor memory device having multiple operational (ECC and redundant memory) modes.

The aforementioned objects may be achieved individually and/or in combination, and it is not intended that the present invention be construed as requiring two or more of the objects to be combined unless expressly required by the claims attached hereto.

According to the present invention, a semiconductor memory device comprising a plurality of semiconductor memory cells is provided. The semiconductor memory cells comprise at least one memory cell configured to selectively operate in either a first mode, in which the memory cell functions as a storing device for ECC information, or in a second mode, in which the memory cell functions as a redundant memory cell. The semiconductor memory device further comprises a controller (also called a signal control device) for signaling if the at least one memory cell is to operate as a storing device for ECC information or as a redundant memory cell. In a first embodiment, the semiconductor memory device is a semiconductor memory component (e.g., an integrated circuit) comprising the signal control device. In a second embodiment, the semiconductor memory device may comprise a plurality of semiconductor memory components and the signal control device. The signal control device may be common to each of the semiconductor memory components of the semiconductor memory device. By way of example, the signal control device may comprise a fuse (e.g., a laser-fuse or an electronic fuse). The signal control device, moreover, may reprogrammable. An electronic or optical read-back device may be provided to determine the status of the signal control device. The semiconductor memory device may further include a redundancy device adapted to replace defective memory cells by redundant memory cells being part of the at least one memory cell.

Further provided is a method of operating a semiconductor memory device comprising a plurality of semiconductor memory cells including at least one memory cell capable of operating as a storing device for ECC information or as a redundant memory cell. The method comprises the steps of registering the status of a signal control device and, depending on the status registered, either operating the at least one memory cell such that it stores or reads ECC information therein or operating the at least one memory cell as a redundant memory cell.

The above and further objects, features and advantages of the present invention will become apparent upon consideration of the following detailed description of specific embodiments thereof, particularly when taken in conjunction with the accompanying drawings, wherein like reference numerals in the various figures are utilized to designate like components.

DETAILED DESCRIPTION

Figure 1:
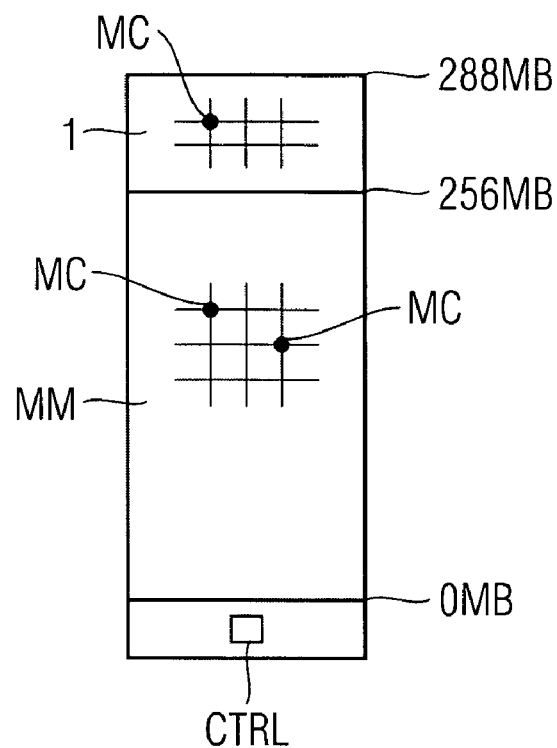
FIG. 1 illustrates a top plan view of a semiconductor memory device according to an embodiment of the invention, showing a plurality of memory cells and a signal control device.

FIG. 1 shows a semiconductor memory device MM comprising a plurality of memory cells MC (for clarity, only two of the memory cells MC are shown). The type of memory cells MC includes, but is not limited to, DRAM memory cells arranged in a matrix. In this embodiment, the semiconductor memory device MM is a component type device, e.g., an individual integrated circuit. At least one of the plurality memory cells MC is a dual mode memory cell—it is adapted to operate in either a first mode, in which it capable of storing and/or reading Error Correction Code (ECC) information, or in a second mode, in which it functions as a redundant memory cell, replacing defective memory cells (and, in particular, individual memory cells that are defective). In operation, each mode is exclusive of the other—the memory cells MC do not function in both modes concurrently. So, in an operating status, the at least one memory cell MC can either be operated as a memory cell that stores and/or reads ECC information or be operated to replace defective memory cells out of the number of remaining memory cells MC (especially individual defective memory cells MC).

As shown in FIG. 1, the semiconductor memory device MM includes a 0 MB tag, a 256 MB tag, and a 288 MB tag. These tags represent, just as an example, boundaries of memory field areas within a 256 MB DRAM. Each of the memory field areas comprise a plurality of memory cells MC. In the illustrated embodiment, 0 MB represents the beginning of a first memory field area of the DRAM. The tag 256 MB represents the edge between a memory field area comprising only single-mode memory cells MC (i.e., the field does not include the dual mode memory cell) and a memory field area 1 comprising the dual mode memory cell (i.e., the at least one memory cell capable of operating in either the first or second functional mode). The 288 MB tag represents the other edge of the memory field area 1 comprising the dual mode memory cells. Consequently, as illustrated in FIG. 1, the at least one memory cell MC capable of operating in either the first or second functional mode is completely contained within a separate memory field area 1.

Additionally, the first embodiment (integrated circuit component) of the semiconductor memory device comprises a signal control device CTRL for signaling in which mode (ECC operation or redundant memory cell operation) the dual mode memory cell MC of a particular semiconductor memory device MM can be operated. As illustrated, the signal control device CTRL is arranged outside of the memory field areas. The signal control device CTRL may include, but is not limited to, a fuse (a laser fuse or an electronic fuse such as a Mode-Control Register Set). With this configuration, if the semiconductor memory device MM is to operate the dual mode memory cell MC in the ECC mode, the fuse may remain intact (i.e., it may not "blow the fuse"). A conventional controller involved with operating semiconductor memories may read back the status of the signal control device CTRL ("not blown" in this example) and, according to the status it reads, will operate the semiconductor memory device MM as a memory comprising, among other memory cells MC, memory cells MC intended for usage in connection with the ECC mode. However, if the fuse is not intact (i.e., if the fuse is blown), the controller may read back the status of the signal control device CTRL as "blown" and, accordingly, operate the dual mode memory cell MC as a redundant memory cell.

The signal control device CTRL may further include a reprogrammable device. This enables the status of the device (e.g., "blown" and "not blown") to be changed several times. The signal control device CTRL may also be integrated into a Mode-Control Register Set. The status of such a Register Set can be changed, as well known, at least within every power-up procedure.

Figure 2:
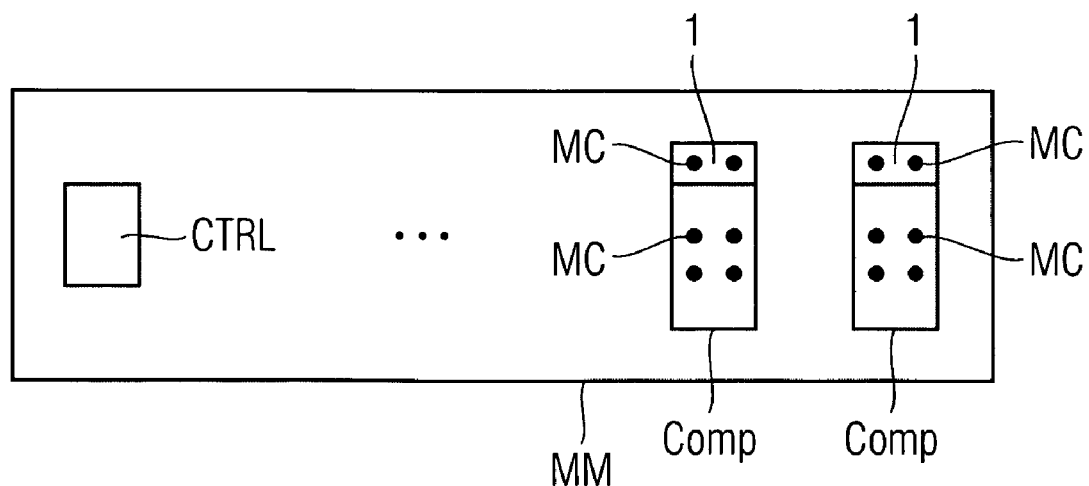
FIG. 2 illustrates a top plan view of a semiconductor memory device according to another embodiment of the invention, showing a plurality of semiconductor memory components in communication with a signal control device.

FIG. 2 shows a semiconductor memory device MM according to a second embodiment of the invention. This embodiment may be of more interest for the industry than the first embodiment just described because, with this second embodiment, the semiconductor memory device MM is represented by a memory board such as a DIMM or SIMM board. In other words, the semiconductor memory device MM of the second embodiment comprises a plurality of individual memory components Comp.

Each of the plurality of memory components Comp comprises memory cells MC arranged in a matrix (for clarity, only a few cells are illustrated in FIG. 2). Similar to the first embodiment, the memory cells MC include at least one dual mode memory cell MC—i.e., a memory cell capable of operating as either a storage device for ECC information or as a redundant memory cell. That is, with respect to the functional arrangement and to the operational capability of the memory cells MC, the memory components Comp of the second embodiment are similar to the semiconductor memory device MM of the first embodiment.

A single signal control device CTRL is also provided in the semiconductor memory device MM. This single signal control device CTRL may be arranged with any of the memory components Comp of the second embodiment; however, is preferable to arrange the single signal control device CTRL separately on the DIMM or SIMM board or, generally, on the semiconductor memory device MM. The signal control device CTRL may comprise devices similar to those described above (e.g., a fuse, a reprogrammable device, etc).

As in the above-described embodiment, the controller that controls the semiconductor memory device MM and the memory components Comp may be operable to read back the status of the signal control device CTRL (e.g., "blown" or "not blown") and, as a result of the status read, the dual mode memory cells MC are operated accordingly. With this configuration, the semiconductor memory device MM is controlled to either operate as a memory device comprising memory cells MC functioning in an ECC mode (the first mode) or as a memory device comprising memory cells MC functioning in a redundant memory cell mode (the second mode), if redundancy is required.

Preferably, a respective memory component Comp, i.e., either an individual memory component Comp like that of the first embodiment or a plurality of components Comp as disclosed in the second embodiment, comprises a redundancy device such as a redundancy decoder, a fuse etc. (which are generally known) to enable full operation of the memory cells MC as redundant memory cells.

According to the invention, the following method of operating a semiconductor memory device MM is advantageous, provided that there is available a semiconductor memory device MM comprising a plurality of semiconductor memory cells MC, and that the plurality of semiconductor memory cells MC comprises at least one memory cell MC adapted to operate in either a first mode, in which it capable of storing and/or reading Error Correction Code (ECC) information, or in a second mode, in which it functions as a redundant memory cell, replacing defective memory cells (and, in particular, individual memory cells that are defective). In operation, the status of a signal control device CTRL is registered (or read back). Once registered, the at least one memory cell MC capable of operating in the first or second mode is operated to either function in the first mode (i.e., as storage device for ECC information) or in the second mode (as a redundant cell).

A semiconductor memory device according to the present invention provides several advantages. It is possible (depending on the status of the signal control device CTRL) to use such a semiconductor memory device in a system equipped with ECC operation as well as in a system without the ECC operation capability. In the latter case, moreover, it is possible to use the at least one memory cell MC as redundancy memory cells. The different kinds of usability are achieved by the fact that the number of connection pins of the semiconductor memory device is always the same whether or not it is used within an ECC system. In contrast, in semiconductor memory devices of the prior art adapted for usage within an ECC system, the number of connection pins is always different from the number of connection pins of a semiconductor memory device not adapted for usage within an ECC system. Additionally, the cost of producing the semiconductor memory device of the present invention is less than the cost of producing the semiconductor memory devices of the prior art because when a semiconductor memory device shows defective memory cells, especially single defective memory cells (e.g., in the cell field(s) outside the area of the dual mode memory cell), it is possible to use the dual mode memory cells as redundant memory cells. Without this possibility of replacing memory cells, the integrity of the semiconductor memory device would diminish.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCES

| | |
|---|---|
| MM | Memory device |
| MC | Memory cells |
| 1 | Area of 1$^{st}$ number of memory cells |
| 0 MB, 256 MB, 288 MB | Edges of memory cell areas |
| CTRL | Signal device |
| Comp | Memory component |

What is claimed is:

1. A semiconductor memory device comprising:
    a plurality of semiconductor memory cells including at least one memory cell capable of operating in a first mode, in which the at least one memory cell functions as a storage device for Error Correction Code information, and in a second mode, in which the at least one memory cell functions as a redundant memory cell; and
    a signal control device operable to signal whether the at least one memory cell is to operate in the first mode or in the second mode.

2. The semiconductor memory device of claim 1, wherein the semiconductor memory device is a semiconductor memory component comprising the signal control device.

3. The semiconductor memory device of claim 1 further comprising a plurality of semiconductor memory components.

4. The semiconductor memory device of claim 3, wherein the signal control device is common to each of the semiconductor memory components.

5. The semiconductor memory device of claim 1, wherein the signal control device is a fuse.

6. The semiconductor memory device of claim 1, wherein the signal control device is a reprogrammable signal control device.

7. The semiconductor memory device of claim 1, wherein a status of the signal control device can be determined by a technical device.

8. The semiconductor memory device of claim 1 further comprising a redundancy device operable to replace a defective memory cell when the at least one memory cell operates in the second mode.

9. A method of operating the semiconductor memory device of claim 1, the method comprising the steps of:
    registering a status of the signal control device and, depending on the status of the signal device, either operating the at least one memory cell in the first mode, in which it acts as a storage device for ECC information, or operating the at least one memory cell in the second mode, in which it acts as a redundant memory cell.

* * * * *